(12) United States Patent
Baumgartner

(10) Patent No.: US 9,413,311 B2
(45) Date of Patent: Aug. 9, 2016

(54) RADIO-FREQUENCY POWER AMPLIFIER

(71) Applicant: Robert Baumgartner, Puchheim/Bhf. (DE)

(72) Inventor: Robert Baumgartner, Puchheim/Bhf. (DE)

(73) Assignee: Siemens Aktiengesellschaft, München (DE)

( * ) Notice: Subject to any disclaimer, the term of this patent is extended or adjusted under 35 U.S.C. 154(b) by 73 days.

(21) Appl. No.: 14/228,019

(22) Filed: Mar. 27, 2014

(65) Prior Publication Data

US 2014/0292408 A1  Oct. 2, 2014

(30) Foreign Application Priority Data

Mar. 27, 2013  (DE) .......................... 10 2013 205 420

(51) Int. Cl.
*H03F 3/217* (2006.01)
*H03F 3/193* (2006.01)

(52) U.S. Cl.
CPC .............. *H03F 3/2171* (2013.01); *H03F 3/193* (2013.01); *H03F 3/2178* (2013.01)

(58) Field of Classification Search
CPC ........................................................ H03F 3/189
USPC ................................ 330/251, 124 R, 295, 51
See application file for complete search history.

(56) References Cited

U.S. PATENT DOCUMENTS

| 4,495,622 | A | 1/1985 | Charruau |
| 4,918,401 | A | 4/1990 | Langer |
| 7,135,919 | B2 * | 11/2006 | Chen ..................... H03F 1/0277 330/124 R |
| 2003/0071731 | A1 | 4/2003 | Jesme |
| 2006/0038710 | A1 | 2/2006 | Staszewski et al. |
| 2012/0229217 | A1 * | 9/2012 | Kawano ............... H03F 1/0261 330/295 |

FOREIGN PATENT DOCUMENTS

JP  2002064339 A  2/2002

OTHER PUBLICATIONS

German Office Action for related German Patent Application No. 10 2013 205 420.3, dated Mar. 22, 2016, with English translation.

* cited by examiner

*Primary Examiner* — Khanh V Nguyen
*Assistant Examiner* — Khiem Nguyen
(74) *Attorney, Agent, or Firm* — Lempia Summerfield Katz LLC

(57) ABSTRACT

A device for radio-frequency power amplification having a switching arrangement is provided. The switching arrangement is configured to amplify, during operation, a radio-frequency input signal that is present at a signal input and has a low input power, and to provide, during continuous wave (CW) operation, a continuous output signal at an output. The switching arrangement includes at least two amplifier devices. A respective output of the at least two amplifier devices is connected to the output of the switching arrangement. Each of the amplifier devices includes at least one switching transistor. The switching transistors are not operable during CW operation without being destroyed. The at least two amplifier devices are drivable as pulse amplifiers with a temporal offset by a control device such that the pulses generated in temporal succession at the outputs of the at least two amplifier devices produce a CW signal at the output.

18 Claims, 2 Drawing Sheets

RADIO-FREQUENCY POWER AMPLIFIER

This application claims the benefit of DE 10 2013 205 420.3, filed on Mar. 27, 2013, which is hereby incorporated by reference in its entirety.

BACKGROUND

The present embodiments relate to a device for radio-frequency power amplification.

In order to generate radio-frequency signals in a frequency range between 1 MHz and 1 GHz and with an output power from approximately 100 W to 1 kW, special radio-frequency power transistors are used. In general, silicon MOSFETs are used as radio-frequency transistors for this purpose. The silicon MOSFETs are used, for example, in particle accelerators or VHF or UHF transmitters. High power losses are sustained during continuous operation (e.g., continuous wave (CW) operation). The power loss is dissipated via a heat sink (e.g., a cooling body) that is thermally conductively connected to the radio-frequency power transistor. The dissipation of the power loss via the heat sink is possible because radio-frequency power transistors of this type have a relatively large active chip area of (e.g., more than 50 mm$^2$) A disadvantage of the radio-frequency power transistors is that the radio-frequency power transistors are very expensive.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a device for radio-frequency power amplification having a switching arrangement that is improved in terms of construction and/or function such that the device may be made available at lower cost is provided.

In one embodiment, a device for radio-frequency power amplification having a switching arrangement is provided. The switching arrangement has a signal input and a signal output and is configured to amplify, during operation, a radio-frequency input signal that is present at the signal input and has a low input power. The switching arrangement is also configured to provide, during CW operation, a continuous output signal at the output. The output signal has a greater output power compared with the input power.

The switching arrangement includes at least two amplifier devices. A respective output of the at least two amplifier devices is connected to the output of the switching arrangement. Each of the amplifier devices includes at least one switching transistor. Owing to the design (e.g., at the frequencies and powers required for radio-frequency power amplification), the switching transistors are not operable during CW operation without being destroyed. The at least two amplifier devices are drivable as pulse amplifiers with a temporal offset using a control device such that the pulses generated in temporal succession at the outputs of the at least two amplifier devices produce a CW signal (e.g., a continuous signal) at the output.

One or more of the present embodiments make it possible to use cheaper switching transistors that are not designed for radio-frequency power amplification (RF power amplification). RF power amplification may be amplification in the frequency range from 1 MHz to 1 GHz at an output power from approximately 100 W to 1 kW. Where a high output power is mentioned in the following description, this may therefore be output powers in the range from approximately 100 W to 1 kW.

Switching transistors of this type not designed for RF power amplification (e.g., SiC or GaN transistors) are used in switched-mode power supplies, for example. However, the switching transistors may also be used to amplify radio-frequency signals up to a frequency range of approximately 500 MHz. Since the active chip area of switching transistors of this type is small, this leads to a very high power density. In switched-mode power supply applications, the switching transistors may be operated with a low power loss because the switching frequency is so low that the efficiency may become very high. However, when such switching transistors are used as radio-frequency amplifiers, CW operation is no longer possible. This results from the fact that the efficiency becomes smaller and smaller with higher frequencies, and therefore, the power loss increases. Owing to the small active chip area, heat dissipation via cooling bodies may not be provided in a practical manner during CW operation owing to the thermal resistance.

One or more of the present embodiments are based on the realization that a radio-frequency power amplifier may also be implemented using switching transistors of this type, which are not usable in RF amplification during CW operation at high output powers if the switching transistors are not operated during CW operation but rather during pulsed operation. For this purpose, in contrast to a conventional RF power amplifier, the switching arrangement (e.g., the component that implements the amplification) is not implemented with a single RF power transistor but with a plurality of amplifier devices, each of which has at least one switching transistor that is not suited for CW operation. By sequentially driving the plurality of amplifier devices in a targeted manner, temporally successive single amplified pulses of the required high output power may be generated, which then result in the desired continuous (CW) signal at the output of the switching arrangement.

At a given instant, in general only one amplifier device is active, and the remaining amplifier devices are passive (e.g., not active). If an amplifier device is active, then the device amplifies the signal present at the input thereof. If an amplifier device is passive, no amplification takes place.

The amplifier devices may be driven such that, at the instant at which an amplifier device ceases to be active, the device becomes passive, and at the same moment, another amplifier device becomes active. The amplifier devices may be driven such that there is a short period between the instant at which an amplifier device ceases to be active and the beginning of the activity of another amplifier device. The amplifier devices may be driven such that the instant at which an amplifier device ceases to be active is temporally after the beginning of the activity of another amplifier device. This constitutes overlapping operation, which is associated with higher losses than the two other variants.

In one configuration, the outputs of the amplifier devices may in each case be connected to the output of the switching arrangement by a $\lambda/4$ line. A $\lambda/4$ line has a line length that is a quarter of the length of the wavelength of the transmitted signal. The $\lambda/4$ line enables isolation of the active amplifier device from the amplifier devices that are passive during the short interval.

In one configuration, the amplifier devices that are not active at a given instant may be transferable to a state such that the amplifier devices represent a short-circuit. Optionally, the amplifier devices have a component having a switching function, or the amplifier devices are in each case coupled to an external component having a switching function. The short-circuit is converted into a high impedance via the connected line. In this way, it is provided that the amplifier device that is active during a short interval outputs its power only to a load connected to the output of the switching arrangement.

The short-circuit to a reference potential may be generatable by driving the switching transistors contained in the amplifier devices. As a result of this, the output of the amplifier devices that are not active at a given instant is connected to the reference potential. In this variant, the component having the switching function is formed by the at least one switching transistor of the amplifier device. This variant enables a simple design of the amplifier device.

In one configuration, the at least one amplifier device may have a single switching transistor. The main connection of the single switching transistor is coupled to a supply voltage via a first coil and is connected, via a first capacitor, to a node of a series circuit including a second coil and a diode. The node is connected to the output of the amplifier device via a second capacitor, and the series circuit is interconnected between a controllable drive voltage and the reference potential. A short-circuit is producible via the diode by controlling the drive voltage. The diode may be a PIN diode. In this variant, the short-circuit is produced by another component of the amplifier device having a switching function. This configuration is advantageous if the supply voltage to the switching transistor would have to be disconnected during the short-circuit phase of the switching transistor in order to prevent a DC short-circuit of the supply voltage. If the diode is not present, the disconnection would take place via an additional switching element, which is unnecessary if the diode is provided.

In one configuration, the at least one amplifier device may have two switching transistors that are interconnected as a half-bridge, and a drive circuit. The half-bridge is interconnected between a supply voltage and the reference potential. Using the drive circuit during the active phase of the amplifier device, the switching transistor that is connected to the supply voltage is operable so as to amplify and, during the passive phase of the amplifier device, the switching transistor represents a short-circuit. In this configuration, it is not necessary to provide the abovementioned diode for forming the short-circuit.

In this variant configuration, part of the radio-frequency signal present at the input of the amplifier device may be rectified in order to drive the switching transistor that is connected to the supply voltage at a predefined voltage during the active phase.

Using the drive circuit, during the active phase of the amplifier device, the switching transistor in the half-bridge that is connected to the reference potential may operate so as to amplify and, during the passive phase, the switching transistor is highly resistive. As a result, short-circuiting of the supply voltage is avoided during the non-active operation, although the switching transistor connected to the supply voltage represents a short-circuit.

In another configuration, the outputs of the amplifier devices may be connected to a respective controllable switching element. The controllable switching elements connect the outputs to a reference potential. The controllable switching element may be arranged inside the amplifier device. The controllable switching element may also be an external component in relation to the amplifier device.

In another configuration, a respective controllable switching element may be arranged between the outputs of the amplifier devices and the output of the switching arrangement. In this configuration, no $\lambda/4$ line is necessary.

The switching transistors may be GaN or SiC transistors. Since the transistors are manufactured in large quantities, the transistors are available at substantially reduced costs in comparison with the silicon MOSFETs conventionally used for RF power amplifiers. As a result, the device for radio-frequency power amplification may be provided at substantially lower cost. Depending on manufacturer and design, switching transistors composed of GaN or SiC have a current density between 4 A/mm$^2$ and 8 A/mm$^2$ By contrast, the current density of a conventional silicon MOSFET used for RF power amplifiers is approximately 0.5 A/mm$^2$ to 2 A/mm$^2$.

For the device described above, the switching transistors may be of the normally on type or normally off type.

DETAILED DESCRIPTION

Figure 1:
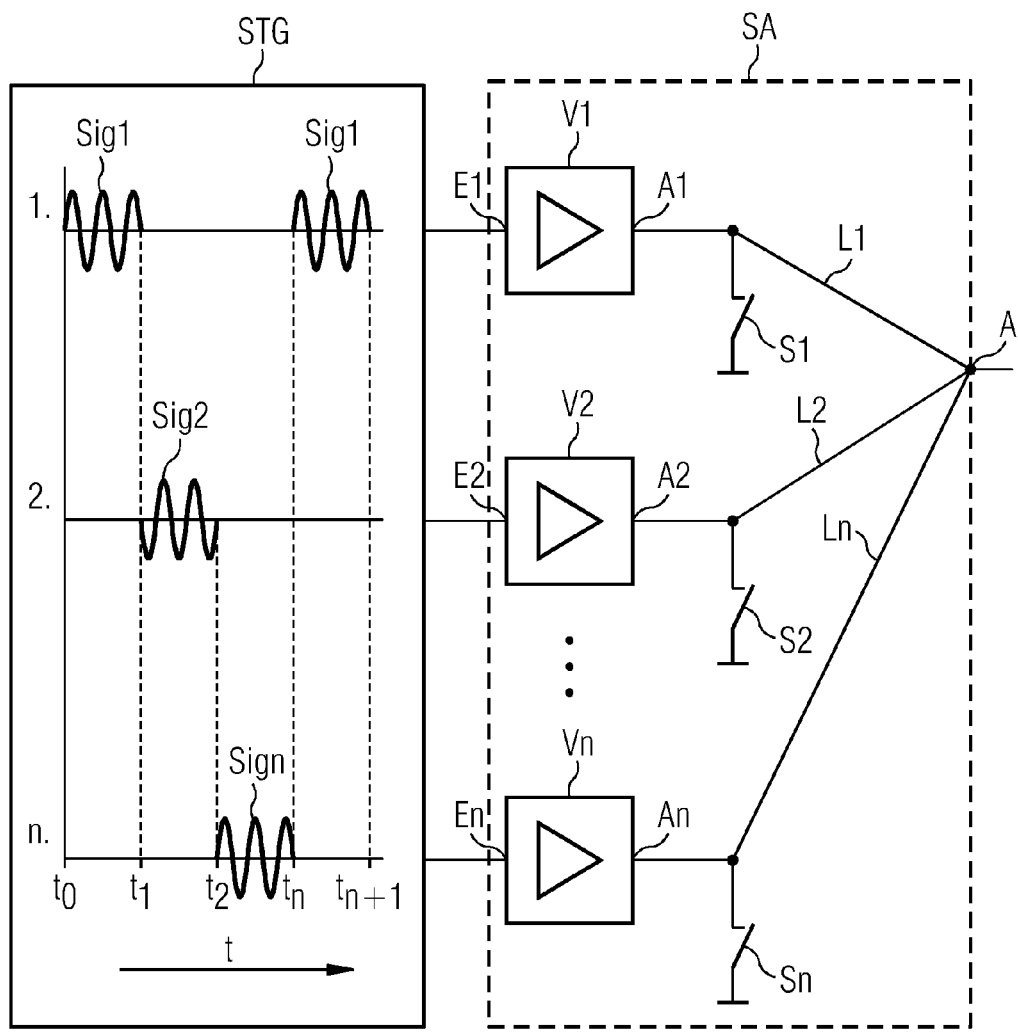
FIG. 1 shows a schematic illustration of one embodiment of a device for radio-frequency power amplification having a switching arrangement that includes a plurality of amplifier devices.

FIG. 1 shows a schematic illustration of a device according to one or more of the present embodiments for radio-frequency power amplification, which is referred to in the following text as RF power amplifier. A switching arrangement SA enables the amplification of a radio-frequency input signal. The RF power amplifier may be used, for example, in a particle accelerator or a VHF or UHF transmitter. The RF power amplifier includes a switching arrangement SA and a control device STG, which feeds an "input signal" to the switching arrangement.

The switching arrangement SA includes a plurality of n amplifier devices V1, V2, ..., Vn (in general: Vi, where i= 1 ... n). In the exemplary embodiment shown, three amplifier devices are illustrated by way of example. The number n is calculated based on the technical data of the switching transistors used in the amplifier devices Vi, the operating frequency, the achievable efficiency and the thermal coupling to the cooling body. The number n is in each case at least "2".

A respective output Ai (i=1 ... n) of the amplifier devices Vi is connected to an output A of the switching arrangement SA via a respective line Li (i=1 ... n). A load (not illustrated) is connected to the output A. The lines Li are in each case $\lambda/4$ lines (e.g., the length thereof corresponds to a quarter of the wavelength of the signal transmitted over the relevant line). Each output Ai of the amplifier devices Vi is also connectable to a reference potential (e.g., a ground potential) via a controllable switching element Si (i=1 ... n). The switching position (e.g., open or closed, or off or on) of the switching elements Si is controlled by the control device STG.

The switching elements Si do not have to be arranged outside of the amplifier devices Vi. The switching elements Si may, however, be arranged outside of the amplifier devices Vi, as shown in FIG. 1. Alternatively, the switching elements Si may also be arranged directly in the lines Li and interrupt the lines Li in the open position. In this case, the lines Li are not to be $\lambda/4$ lines. In this case, the lines Li may be very short.

Each of the amplifier devices Vi includes at least one switching transistor (not shown in FIG. 1), where the switching transistors, owing to the configuration, are not operable in continuous operation at the frequencies (e.g., 30 MHz to 1

GHz) and powers (e.g., approximately 1 kW) required for RF power amplification without being destroyed. Continuous operation is also referred to as continuous wave (CW) operation. By way of example, GaN (gallium nitride) or SiC (silicon carbide) transistors are used as switching transistors in the amplifier devices Vi.

GaN and SiC transistors are used as switching transistors in switched-mode power supplies. In switched-mode power supply applications, the switching transistors may be operated with a low power loss. However, the switching transistors may also be used to amplify radio-frequency signals up to a frequency range of approximately 500 MHz. Since the active chip area of such switching transistors is small, this leads to a very high power density in the required power range.

A known SiC transistor by the company Infineon has, for example, a chip area of 9 mm$^2$ at a current Idss=50 A and a maximum drain voltage Ud, max=1700 V. This results in a current density of 5.6 A/mm$^2$. A known GaN transistor by the company EPC has, for example, a chip area of 2 mm$^2$ at a current Idss=15 A and a maximum drain voltage Ud, max=200 V. This results in a current density of 7.5 A/mm$^2$.

By way of comparison, an exemplary conventional Si MOSFET by the company Freescale, which is configured for RF power amplification, by contrast has the following characteristic data: a chip area of 80 mm$^2$ at a current Idss=80 A and a maximum drain voltage Ud, max=125 V. This results in a current density of 1 A/mm$^2$.

When GaN or SiC transistors are used in an RF power amplifier, no CW operation of the transistors is therefore possible. This results from the fact that the efficiency of the GaN or SiC transistors becomes lower and lower with increasing frequencies, and therefore, the power loss increases. Owing to the small active chip area, heat dissipation via a cooling body is not possible in a practical manner during CW operation owing to the thermal resistance, which explains the fundamental lack of suitability of the transistors for an RF power amplification.

Since it is not possible to generate CW signals with a high power in the range from approximately 100 W to 1 kW using only one of the switching transistors, the amplifier devices Vi are operated in a temporally offset manner not as CW amplifiers but as pulse amplifiers. The temporal control of the amplifier devices Vi occurs using the control device STG. For this purpose, the control device STG is connected to respective inputs Ei (i=1 . . . n) of the amplifier devices Vi. A radio-frequency input signal Sig1, . . . , Sign is fed to the inputs Ei (i=1 . . . n) at predefined instants $t_0$ to $t_3$. The radio-frequency input signal Sig1, . . . , Sign is amplified by the relevant amplifier device Vi. Collectively, the inputs Ei of the amplifier devices Vi constitute an input of the switching arrangement SA. The pulses amplified by the amplifier devices Vi produce, in succession, the desired CW signal for the load at the output A.

The "control mechanism" performed by the control device STG is also illustrated in FIG. 1. At the instant $t_0$, a signal pulse (pulse) of duration $\Delta t_1$ is fed as input signal Sig1 to the input E1 of the amplifier device V1. The pulse has a duration of $\Delta t_1 = t_2 - t_1$. During the duration $\Delta t_1$, the amplifier device V1 is switched so as to be active, with the result that the pulse represented by Sig1 is amplified by the amplifier device V1 and is output at the output A1. The amplified pulse is also present at the output A of the switching arrangement SA. At the instant $t_1$, the amplifier device V1 is switched so as to be passive, with the result that the amplifier device no longer amplifies or may no longer amplify.

At the instant $t_1$, a signal pulse (pulse) of duration $\Delta t_2$ is fed as input signal Sig2 to the input E2 of the amplifier device V2. The pulse has a duration of $\Delta t_2 = t_3 - t_2$. During the duration $\Delta t_1$, the amplifier device V2 is switched so as to be active, with the result that the pulse represented by Sig2 is amplified by the amplifier device V2 and is output at the output A2. The amplified pulse is then also present at the output A of the switching arrangement SA. At the instant $t_2$, the amplifier device V2 is switched so as to be passive, with the result that the amplifier device no longer amplifies or may no longer amplify.

This procedure is also repeated in a corresponding manner for the nth amplifier device Vn. At the instant $t_{n-1}$ (e.g., $t_2$), a signal pulse (pulse) of duration $\Delta t_n$ is fed as input signal Sign to the input En of the amplifier device Vn. The pulse has a duration of $\Delta t_n = t_n - t_{n-1}$. During the duration $\Delta t_n$, the amplifier device Vn is switched so as to be active, with the result that the pulse represented by Sign is amplified by the amplifier device Vn and is output at the output An. The amplified pulse is then also present at the output A of the switching arrangement SA. At the instant $t_n$, the amplifier device Vn is switched so as to be passive, with the result that the amplifier device no longer amplifies or may no longer amplify.

In the following text, the described procedure is carried out again using the amplifier device V1. The pulses amplified by the amplifier devices Vi produce, in succession, the desired CW signal for the load at the output A.

In the described exemplary embodiment, only one amplifier device Vi is ever active at any given instant. The others are switched so as to be passive (e.g., not amplifying) by the control device STG. In principle, operation in which two amplifier devices are operated in a temporally overlapping manner may also be provided. However, this is associated with certain losses. In a further alternative, there may also be a short temporal gap during the transfer between two active amplifier devices. In this gap, none of the amplifier devices Vi are active.

The pulse durations $\Delta t_1$, $\Delta t_2$, $\Delta t_n$ may be the same length. The pulse durations $\Delta t_1$, $\Delta t_2$, $\Delta t_n$ may also have a different duration.

The amplifier devices Vi are isolated from one another by the above-described λ/4 lines so that the amplifier device Vi that is active during a short period outputs a power only to the load connected to the output A, and not also to the amplifier devices that are currently passive. In addition, using the switching elements Si, the amplifier devices that are not active at present represent a short-circuit. The short-circuit is transformed into a high impedance via the associated line. For this purpose, the switching elements Si of the passive amplifier devices Vi are switched on, with the result that a connection is made from the associated outputs Ai to the reference potential. In principle, a connection that is only effective for the operating frequency (e.g., a connection implemented using a capacitor) is sufficient.

Figure 2:
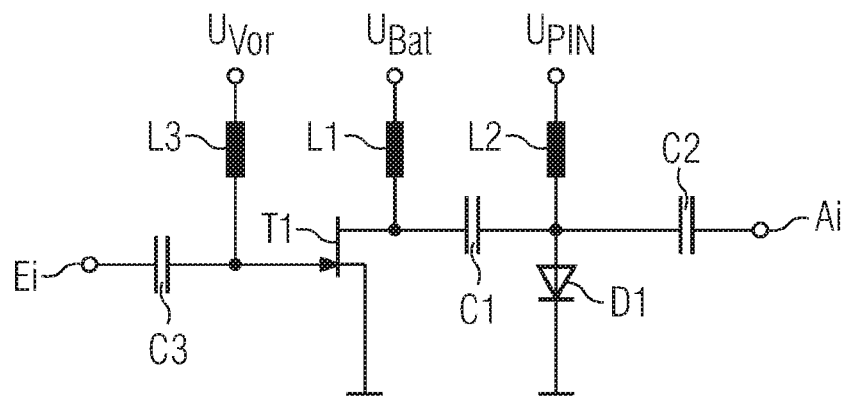
FIG. 2 shows a first exemplary embodiment of an amplifier device as may be used in the device shown in FIG. 1.
Figure 3:
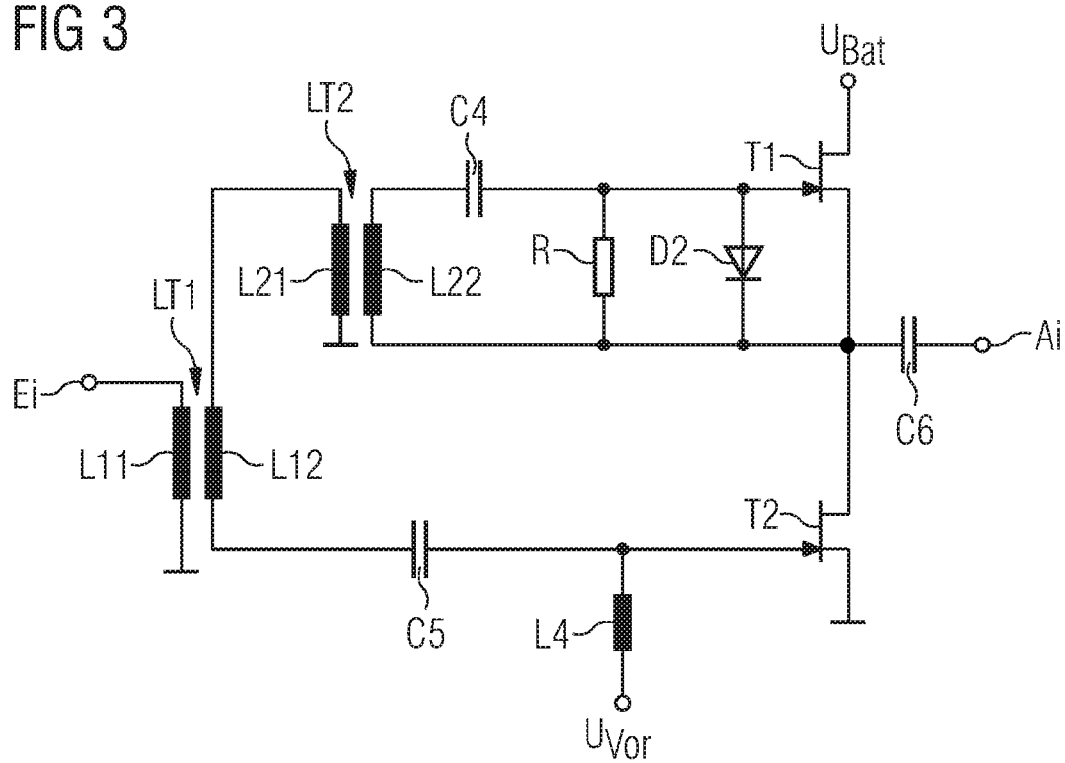
FIG. 3 shows a second exemplary embodiment of an amplifier device as may be used in the device shown in FIG. 1.

The short-circuit may not be produced by the switching elements Si (e.g., external switching elements in the schematic illustration in FIG. 1), rather the short-circuit may be produced by the configuration of the amplifier device Vi. FIGS. 2 and 3 show exemplary embodiments of the amplifier devices Vi.

FIG. 2 shows an exemplary embodiment in which the amplifier device Vi has a single switching transistor T1 and in which the short-circuit is produced by a diode D1. The diode D1 may be embodied, for example, as a PIN diode. The switching transistor T1 is a GaN or SiC transistor of the normally on type. The control input thereof is connected to the input Ei of the amplifier device Vi via a capacitor C3. A node between the capacitor C3 and the control connection is connected to a voltage connection for a bias voltage Uvor via a coil L3. If a negative voltage is present at the voltage connection, then the switching transistor T1 is off. A voltage between 0 and the negative voltage is applied to the input Ei using the radio-frequency input signal. This AC voltage is then shifted by the value of Uvor at the gate of the transistor (e.g., class B mode of operation), with the result that the switching transistor T1 alternately blocks and conducts.

A switching transistor of the normally off type with an adapted drive circuit may also be used instead of the switching transistor of the normally on type.

The load path of the switching transistor T1 is connected in series with a coil L1. The series circuit is interconnected between a supply voltage connection and the reference potential, where the coil L1 has a constant supply voltage Ubat applied thereto via the supply connection. The node of this series circuit is connected via a capacitor C1 to the node of a further series circuit including a coil L2 and the diode D1, which has already been mentioned. The series circuit L2, D1 is interconnected between a supply voltage connection for a controllable drive voltage UPIN and the reference potential. The output Ai of the amplifier device Vi is connected to the node of the series circuit L2, D1 via a capacitor C2.

If the amplifier device Vi is active, then a UPIN≤0 V is selected. In the case of a passive amplifier device, if the drive voltage (e.g., no voltage=0 V is present at the input Ei) is intended to produce the short-circuit, then UPIN is adjusted to be >0 V.

This procedure provides the advantage that the transistor does not have to make the short-circuit. A switched-on transistor would short-circuit the supply voltage. Therefore, the supply voltage would be disconnected from the amplifier circuit during this time.

In the exemplary embodiment shown in FIG. 3, a half-bridge including two switching transistors T1, T2 of the normally on type is provided instead of a single switching transistor. As a result, the PIN diode, illustrated in FIG. 2, for producing the short-circuit may be omitted. The half-bridge T1, T2 is interconnected between the supply voltage connection and the reference potential, where the switching transistor T1 has a constant supply voltage Ubat applied thereto. The node of the half-bridge T1, T2 is interconnected to the output Ai of the amplifier device Vi via a capacitor C6. During operation, a voltage Ubat/2 is present at the node, where the capacitor C6 provides that no direct current may drain on the load side and would thus shift the operating point.

In order that the switching transistor T1 receives the appropriate negative gate-source voltage for optimum operation during the active amplifier phase, a small part of the radio-frequency signal present at the input Ei is rectified at the control connection (e.g., gate) thereof. This takes place using the power dividers LT1 (e.g., including coils L11 and L12), LT2 (e.g., including coils L21 and L22), the capacitor C4, the resistor R and the diode D2. The diode D2 serves to produce a reverse voltage for the switching transistor T1. The resistor R makes sure that the gate-source voltage is 0 if no signal is present at the input Ei (e.g., the amplifier device Vi is passive). The power divider LT1 is a 180° power divider.

In addition to the power divider LT2, the coil L12 of the power divider LT1 is connected to the control connection (e.g., gate) of the switching transistor T2 using a coil connection via a capacitor C5. The control connection of the switching transistor T2 is connected to the voltage connection for a bias voltage Uvor via a coil L4. If a negative voltage is present at the voltage connection, then the switching transistor T2 is off. The capacitors C4, C5 are used for a DC interruption.

If the radio-frequency signal at the input Ei is disconnected, the switching transistor T1 changes its state to a short-circuit. The switching transistor is therefore implementing the class B operation during the active phase of the amplifier device and will form a short-circuit during the passive phase.

The bias voltage Uvor of the switching transistor T2 is, as described, fed from the outside and always remains negative in the active and passive operating cases. This leads to the switching transistor T2 operating with class B operation in the active case and remaining highly resistive in the passive case. Hence, a short-circuit of the supply voltage Ubat is avoided, although the switching transistor T1 represents a short-circuit in the passive case.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A device for radio-frequency power amplification, the device comprising:
    a switching arrangement with a signal input and a signal output, the switching arrangement being configured to amplify, during operation, a radio-frequency input signal that is present at the signal input and has an input power, and to provide, during continuous wave (CW) operation, a continuous output signal at the signal output, the continuous output signal having a greater output power compared with the input power,
    wherein the switching arrangement comprises at least two amplifier devices, a respective output of the at least two amplifier devices being connected to the signal output of the switching arrangement,
    wherein each amplifier device of the at least two amplifier devices comprises a switching transistor, wherein the switching transistors are configured to be inoperable during the CW operation without being destroyed,
    wherein the at least two amplifier devices are drivable as pulse amplifiers with a temporal offset using a control device such that pulses generated in temporal succession at the outputs of the at least two amplifier devices produce a CW signal at the signal output of the switching arrangement, and
    wherein a respective controllable switching element is arranged between the outputs of the at least two amplifier devices and the signal output of the switching arrangement.

2. The device of claim 1, wherein the outputs of the at least two amplifier devices are in each case connected to the signal output of the switching arrangement using a λ/4 line.

3. The device of claim 1, wherein the at least two amplifier devices, which are not active at a given instant, are transferable to a state such that the at least two amplifier devices represent a short-circuit.

4. The device of claim 3, wherein the at least two amplifier devices comprise a component having a switching function, or the at least two amplifier devices are in each case coupled to an external component having a switching function.

5. The device of claim 3, wherein the short-circuit to a reference potential is generatable by driving the switching transistors included in the at least two amplifier devices, as a result of which the outputs of the at least two amplifier devices, which are not active at a given instant, are connected to the reference potential.

6. The device of claim 1, wherein the switching transistors are GaN or SiC transistors.

7. The device of claim 1, wherein the switching transistors are of the normally on type or normally off type.

8. A device for radio-frequency power amplification, the device comprising:
   a switching arrangement with a signal input and a signal output, the switching arrangement being configured to amplify, during operation, a radio-frequency input signal that is present at the signal input and has an input power, and to provide, during continuous wave (CW) operation, a continuous output signal at the signal output, the continuous output signal having a greater output power compared with the input power,
   wherein the switching arrangement comprises at least two amplifier devices, a respective output of the at least two amplifier devices being connected to the signal output of the switching arrangement,
   wherein each amplifier device of the at least two amplifier devices comprises a switching transistor, wherein the switching transistors are configured to be inoperable during the CW operation without being destroyed,
   wherein the at least two amplifier devices are drivable as pulse amplifiers with a temporal offset using a control device such that pulses generated in temporal succession at the outputs of the at least two amplifier devices produce a CW signal at the signal output of the switching arrangement,
   wherein at least one amplifier device of the at least two amplifier devices comprises a single switching transistor, a main connection of the single switching transistor being coupled to a supply voltage via a first coil and being connected, via a first capacitor, to a node of a series circuit comprising a second coil and a diode,
   wherein the node is connected to the output of the at least one amplifier device via a second capacitor, and the series circuit is interconnected between a controllable drive voltage and a reference potential, and
   wherein a short-circuit is producible via the diode by controlling the drive voltage.

9. The device of claim 8, wherein the outputs of the at least two amplifier devices are in each case connected to the signal output of the switching arrangement using a λ/4 line.

10. The device of claim 8, wherein the switching transistors are GaN or SiC transistors.

11. A device for radio-frequency power amplification, the device comprising:
   a switching arrangement with a signal input and a signal output, the switching arrangement being configured to amplify, during operation, a radio-frequency input signal that is present at the signal input and has an input power, and to provide, during continuous wave (CW) operation, a continuous output signal at the signal output, the continuous output signal having a greater output power compared with the input power,
   wherein the switching arrangement comprises at least two amplifier devices, a respective output of the at least two amplifier devices being connected to the signal output of the switching arrangement,
   wherein each amplifier device of the at least two amplifier devices comprises a switching transistor, wherein the switching transistors are configured to be inoperable during the CW operation without being destroyed,
   wherein the at least two amplifier devices are drivable as pulse amplifiers with a temporal offset using a control device such that pulses generated in temporal succession at the outputs of the at least two amplifier devices produce a CW signal at the signal output of the switching arrangement,
   wherein at least one amplifier device of the at least two amplifier devices comprises two switching transistors that are interconnected as a half-bridge, and a drive circuit,
   wherein the half-bridge is interconnected between a supply voltage and a reference potential, and
   wherein, using the drive circuit, during an active phase of the at least one amplifier device, a first switching transistor of the two switching transistors, which is connected to the supply voltage, is operable so as to amplify, and during a passive phase of the at least one amplifier device, the switching transistor represents a short-circuit.

12. The device of claim 11, wherein part of the radio-frequency signal present at an input of the at least one amplifier device is rectified in order to drive the first switching transistor, which is connected to the supply voltage at a predefined voltage during the active phase.

13. The device of claim 11, wherein, using the drive circuit, during the active phase of the at least one amplifier device, a second switching transistor of the two switching transistors, which is in the half-bridge and is connected to the reference potential is operable so as to amplify, and during the passive phase, the second switching transistor is highly resistive.

14. The device of claim 11, wherein the outputs of the at least two amplifier devices are in each case connected to the signal output of the switching arrangement using a λ/4 line.

15. The device of claim 11, wherein the switching transistors are GaN or SiC transistors.

16. A device for radio-frequency power amplification, the device comprising:
   a switching arrangement with a signal input and a signal output, the switching arrangement being configured to amplify, during operation, a radio-frequency input signal that is present at the signal input and has an input power, and to provide, during continuous wave (CW) operation, a continuous output signal at the signal output, the continuous output signal having a greater output power compared with the input power,
   wherein the switching arrangement comprises at least two amplifier devices, a respective output of the at least two amplifier devices being connected to the signal output of the switching arrangement,
   wherein each amplifier device of the at least two amplifier devices comprises a switching transistor, wherein the switching transistors are configured to be inoperable during the CW operation without being destroyed,
   wherein the at least two amplifier devices are drivable as pulse amplifiers with a temporal offset using a control device such that pulses generated in temporal succession at the outputs of the at least two amplifier devices produce a CW signal at the signal output of the switching arrangement, and wherein the outputs of the at least two amplifier devices are connected to a respective controllable switching element, the controllable switching elements connecting the outputs to a reference potential.

17. The device of claim 16, wherein the outputs of the at least two amplifier devices are in each case connected to the signal output of the switching arrangement using a $\lambda/4$ line.

18. The device of claim 16, wherein the switching transistors are GaN or SiC transistors.

* * * * *